(12) United States Patent
Dutton et al.

(10) Patent No.: US 12,063,040 B2
(45) Date of Patent: Aug. 13, 2024

(54) RECONFIGURABLE HIGH VOLTAGE GENERATION CIRCUIT FOR SPAD SENSORS

(71) Applicant: STMicroelectronics International N.V., Geneva (CH)

(72) Inventors: Neale Dutton, Edinburgh (GB); Steven Collins, Scotland (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 0 days.

(21) Appl. No.: 17/954,957

(22) Filed: Sep. 28, 2022

(65) Prior Publication Data

US 2024/0106419 A1 Mar. 28, 2024

(51) Int. Cl.
*H03K 3/017* (2006.01)
*H03H 11/28* (2006.01)

(52) U.S. Cl.
CPC ............. *H03K 3/017* (2013.01); *H03H 11/28* (2013.01)

(58) Field of Classification Search
CPC ............ H03K 3/017; H03K 5/04; H03K 7/08; H03H 11/28; H02H 3/20; H02H 3/202; H02H 3/207; H02H 3/24
See application file for complete search history.

(56) References Cited

U.S. PATENT DOCUMENTS 10,594,313 B2 * 3/2020 Zhang .................. H03K 17/082
2004/0263231 A1 12/2004 Trafton et al.
2016/0190926 A1 6/2016 Ni et al.
2019/0250257 A1 8/2019 Finkelstein et al.
2020/0220388 A1 7/2020 Liu et al.

(Continued)

FOREIGN PATENT DOCUMENTS

CN 114625203 A 6/2022
WO 2022107512 A1 5/2022
WO 2022107570 A1 5/2022

OTHER PUBLICATIONS

Arvani, Foad, et al.: "A Reconfigurable 5-Channel Ring-Oscillator-Based TDC for Direct Time-of-Flight 3D Imaging," IEEE Transactions on Circuits and Systems—II: Express Briefs, vol. 69, No. 5, May 2022, 5 pgs.

(Continued)

*Primary Examiner* — Jung Kim
(74) *Attorney, Agent, or Firm* — Crowe & Dunlevy LLC

(57) ABSTRACT

A system-on-a-chip (SOC) within a package includes a reference generator, a matching circuit, a programmable current generator, a PWM controller, an overvoltage/undervoltage detector receiving a high voltage from a third output pad, a multiplexer passing an input signal to a second output pad, and a SPAD receiving the high voltage. Switching circuitry includes a first switch between the reference generator and an input of the programmable current generator, a second switch between the input of the current generator and the output of the matching circuit, a third switch between the reference generator and an input of the matching circuit, a fourth switch between an output of the current generator and a tap of a ladder within the overvoltage/undervoltage detector, a fifth switch between an output of the current generator and the first output pad, and a sixth switch between the output of the PWM controller and the first output pad.

18 Claims, 5 Drawing Sheets

(56) References Cited

U.S. PATENT DOCUMENTS

2020/0326414 A1 10/2020 Delic et al.
2022/0137192 A1 5/2022 Yin et al.

OTHER PUBLICATIONS

Hutchings, Sam W., et al: "A Reconfigurable 3-D-Stacked SPAD Imager With In-Pixel Histogramming for Flash LIDAR or High-Speed Time-of-Flight Imaging," IEEE Journal of Solid-State Circuits, 2019, 10 pgs.
Shen, Boyu, et al: "On-Chip High-Voltage SPAD Bias Generation Using a Dual-mode, Closed-loop Charge Pump," IEEE, 2017, 4 pgs.
EP Search Report and Written Opinion for counterpart EP Appl. No. 23197694.5, report dated Feb. 9, 2024, 8 pgs.

\* cited by examiner

RECONFIGURABLE HIGH VOLTAGE GENERATION CIRCUIT FOR SPAD SENSORS

TECHNICAL FIELD

This disclosure is related to a reconfigurable high voltage generation control circuit for integration within a time-of-flight sensor chip that permits the sensor chip to be usable with high voltage components involved in generation of the high voltage used to bias the photodetectors within the sensor chip, regardless of whether or not those high voltage components are within a same package as the sensor chip.

BACKGROUND

Time-of-flight systems are used to measure distance to a target. There are two general classifications of time-of-flight systems, namely direct and indirect. As an example, with direct time-of-flight systems, an emitter such as a laser diode (typically infrared) is driven with a pulsed drive current to cause it to emit a short laser pulse in a given direction. This laser pulse is reflected by an object present in that given direction, and a receiver with a detector receives and senses the reflected laser pulse. The receiver, with a proper timing reference, measures the elapsed time between emitting of the laser pulse and receipt of the reflected laser pulse. From this elapsed time, the distance to the object can be evaluated. Through the use of an array of receiving elements in the receiver, a three-dimensional map of the object can therefore be formed. This three-dimensional map of the object may be a map of a human face, for example, and may be used to identify authorized users of an electronic device such as a smartphone or tablet into which the time-of-flight system is incorporated.

A sample known receiver 13 for use in a time-of-flight (TOF) system 10 is shown in FIG. 1 and includes a single photon avalanche diode (SPAD) 14 having its cathode coupled to a high voltage VHV generated by high voltage (HV) generation circuitry 12 and its anode coupled to ground through a quench resistor 15. The high voltage VHV biases the SPAD 14 above its breakdown voltage. When the SPAD 14 is struck by an incoming photon, an output pulse is sourced from the anode of the SPAD 14, which may then be detected by a readout amplifier 16 and interpreted to provide detection data for use in calculating time-of-flight.

The higher a SPAD is biased above its breakdown voltage, the more photosensitive the SPAD becomes in operation; the breakdown voltage of a SPAD increases as the temperature of the SPAD increases. Therefore, it is desirable for the high voltage generation circuit 12 to regulate the high voltage VHV over temperature so that the differential between VHV and the breakdown voltage of the SPAD remains the same over temperature change, thereby maintaining the desired level of photosensitivity of the SPAD.

A sample real world implementation of the time-of-flight system 10 is now described with reference to FIG. 2. The TOF system 10 includes the high voltage generation circuitry 12 and a package 30, with a flex section 23 (i.e. flexible substrate) carrying the electrical connections therebetween.

The HV generation circuitry 12 includes a boost converter 20 that alternatingly creates a connection that transfers energy from the battery VBAT to an inductor L and disrupts that connection to thereby create a ripple current that is used to generate the high voltage (VHV). In particular, a boost circuit 21 within the boost converter 20 includes the components that facilitate the selective alternating connection between the inductor L and ground, and a boost controller 22 controls the boost circuit 21 to perform this operation to thereby generate VHV. When enabled by an enable signal EN received from the package 30, the boost controller 22 generates a pulse width modulation (PWM) signal that controls the boost circuit 21 so as to cause generation and regulation of the high voltage VHV at a level set by an adjustment signal ADJ received from the package 30, with the boost controller 22 receiving a feedback signal FBK from the boost circuit 21 during operation.

The package 30 includes a system-on-a-chip (SOC) 13 that generates the enable signal EN and the adjustment signal ADJ, one or more single photon avalanche diodes (SPADs) 14, and time-of-flight circuitry that generates time-of-flight data based upon output from the SPADs 14.

This TOF system 10 of FIG. 2 is effective at performing desired functionality. However, the high voltage generation circuitry 12 being external to the package 30 means that the TOF system 10 occupies more space than desired, and in certain applications, space is at a premium. Still further, the TOF system 10 may be relatively costly to manufacture due to the high voltage generation circuitry 12 being external to the package 30.

To address this, in another sample real world implementation of the time-of-flight system 10' shown in FIG. 3, the boost controller 22 is incorporated within the SOC 13', with the boost circuit 21 and inductor L being incorporated within the package 30'. This provides for a TOF system 10' within a single package 30', saving space and cost.

Consider now though that the SOC 13' of the implementation of FIG. 3 is different than the SOC 13 of the implementation of FIG. 2. This means that if a manufacturer of the SOC 13 intends on supporting both implementations, it manufactures two separate SOCs, one for each implementation. This is inefficient, as two production lines are utilized, driving up the overall cost of the SOCs. This also adds to the complexity of the manufacturer needing to accurately estimate the proper amount of each different SOC to manufacture. Given this, it would be highly desirable if a manufacturer could manufacture a single SOC that supports both implementations described above. As such, further development remains necessary.

SUMMARY

Disclosed herein is an electronic device including a system-on-a-chip (SOC) within a package. The SOC has at least the following formed therein: a reference generator; a matching circuit; a programmable current generator configured to generate a programmed current; a pulse width modulation controller; an overvoltage/undervoltage detection circuit configured to receive a high voltage from a third output pad and determine whether an overvoltage or undervoltage condition is present; a multiplexer configured to selectively pass an input signal to a second output pad; at least one single photon avalanche diode (SPAD) having an anode coupled to receive the high voltage; and switching circuitry.

The switching circuitry is configured to, in an external generation mode: cause the multiplexer to pass an enable signal at its input to the second output pad; connect an output of the reference generator to the programmable current generator such that the programmable current generator receives a temperature independent reference current generated by the reference generator in the external generation mode; and connect the programmed current to a first output pad.

The switching circuitry is configured to, in an internal generation mode: connect an output of the reference generator to the matching circuit such that the matching circuit receives a temperature independent reference voltage generated by the reference generator in the internal generation mode; connect an output of the matching circuit to the programmable current generator so that the programmable current generator receives a matched temperature independent reference current generated by the matching circuit in the internal generation mode; connect the programmed current to the overvoltage/undervoltage detection circuit, with a feedback voltage being generated by components of the overvoltage/undervoltage detection circuit in the internal generation mode; cause the multiplexer to pass a pulse width modulation (PWM) signal at its input to the second output pad, the PWM signal being generated by the pulse width modulation controller based upon the feedback voltage, in the internal generation mode; and couple the PWM signal to the first output pad.

When the switching circuitry is in the external generation mode, the electronic device includes, outside of the package: feedback circuitry having a feedback node connected to the first output pad; and a boost converter having a power input connected to a battery voltage through an inductor, a feedback input connected to the feedback node, an enable input connected to the second output pad, and an output at which the high voltage is generated, the output being connected to the third output pad.

When the switching circuitry is in the internal generation mode, the electronic device includes, inside the package: a boost circuit comprising: a boost diode having a cathode coupled to the third output pad and an anode coupled to a battery voltage through an inductor; a switch connected between the anode of the boost diode and ground, the switch coupled to the first and second output pads to be controlled by the PWM signal; and a capacitor coupled between the third output pad and ground, wherein the high voltage is produced at the third output pad.

The overvoltage/undervoltage detection circuit includes: a resistive ladder coupled between the third output pad and ground, the resistive ladder having at least first, second, and third taps, each tap being located between two immediately adjacent and directly electrically connected resistors of the resistive ladder, wherein the feedback voltage is generated at the second tap; a first comparator configured to assert an undervoltage condition alert signal if a voltage at the first tap is less than a lower threshold; and a second comparator configured to assert an overvoltage condition alert signal if a voltage at the third tap is greater than an upper threshold.

The matching circuit includes an amplifier in a unity gain configuration configured to buffer the temperature independent reference voltage to a first terminal of a matching resistor, with the switching circuitry, in the internal generation mode, connecting a second terminal of the matching resistor to the input of the programmable current generator; wherein a resistance of the matching resistor is equal to a total resistance of the resistive ladder.

The switching circuitry includes: a first switch connected between the reference generator and an input of the programmable current generator; a second switch connected between the input of the programmable current generator and the output of the matching circuit; a third switch connected between the reference generator and an input of the matching circuit; a fourth switch connected between an output of the programmable current generator and a tap of a resistive ladder within the overvoltage/undervoltage detection circuit; a fifth switch connected between an output of the programmable current generator and the first output pad; and a sixth switch connected between the output of the PWM controller and the first output pad.

The SOC includes control circuitry configured to: in the external generation mode, cause the first and fifth switches to close while causing the second, third, fourth, and sixth switches to open; and in the internal generation mode, cause the second, third, fourth, and sixth switches to close while causing the first and fifth switches to open.

The SOC also includes control circuitry configured to generate a control signal for the programmable current generator based upon which the programmable current generator sets a magnitude of the programmed current. The high voltage is set based upon the programmed current.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Do note that in the below description, any described resistor or resistance is a discrete device unless the contrary is stated, and is not simply an electrical lead between two points. Thus, any described resistor or resistance coupled between two points has a greater resistance than a lead between those two points would have, and such resistor or resistance cannot be interpreted to be a lead. Similarly, any described capacitor or capacitance is a discrete device unless the contrary is stated, and is not a parasitic unless the contrary is stated. Moreover, any described inductor or inductance is a discrete device unless the contrary is stated, and is not a parasitic unless the contrary is stated.

Disclosed herein is a system-on-a-chip (SOC) 113 that includes a reconfigurable high voltage (VHV) controller 126 that enables the SOC 113 to be used with either external high voltage generation circuitry 112 (FIG. 4) or high voltage generation circuitry 112' integrated together with the SOC 113 into a single package 130' (FIG. 5), to form a time-of-flight system 100. Specifics of the SOC 113 will be given in detail below, however, first, specific details of the embodiments of FIGS. 4 and 5 will be given so that the full system functionality provided by the SOC 113 can be appreciated.

Figure 1:
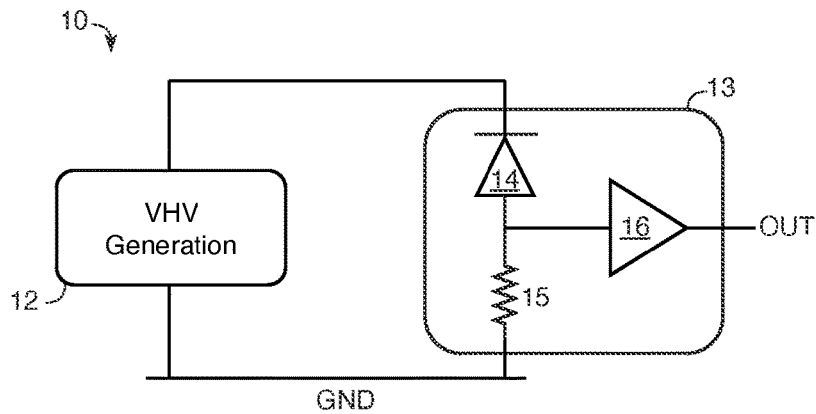
FIG. 1 is a block diagram of a prior art time-of-flight system.
Figure 2:
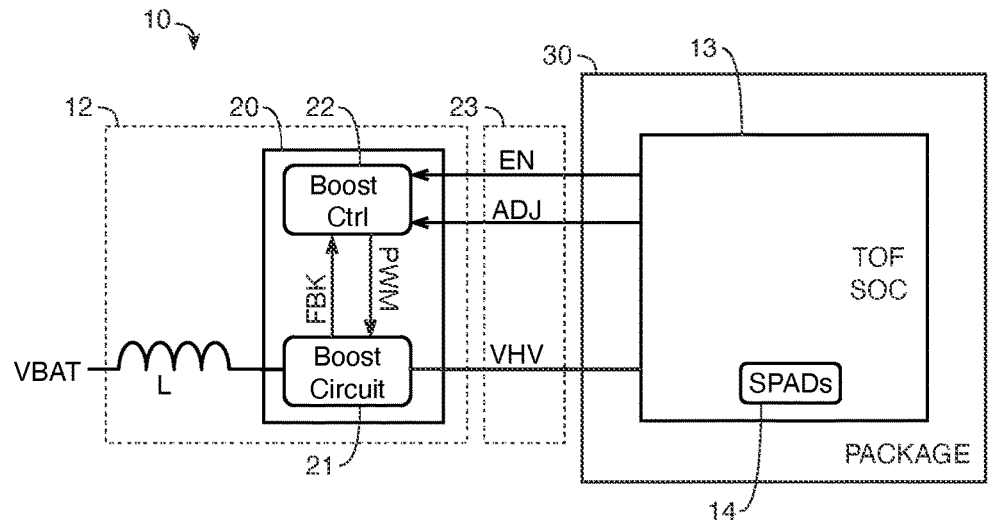
FIG. 2 is a block diagram of a first prior art time-of-flight sensing system.
Figure 3:
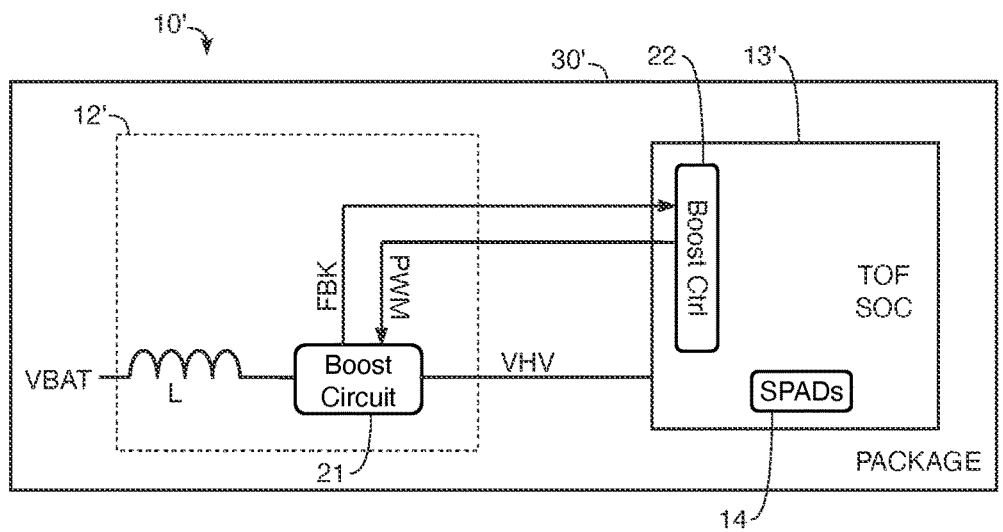
FIG. 3 is a block diagram of a first prior art time-of-flight sensing system.
Figure 4:
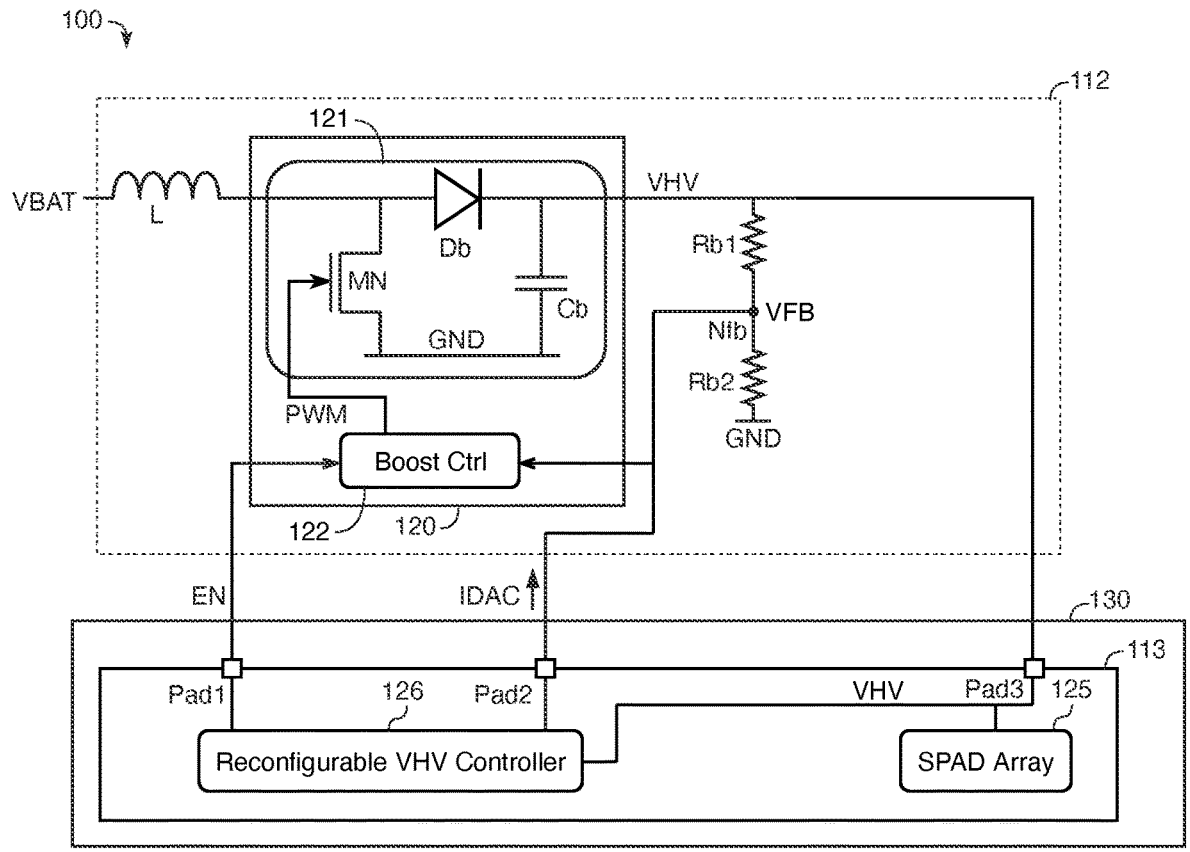
FIG. 4 is a block diagram of a first time-of-flight sensing system configuration described herein utilizing a system-on-a-chip described herein.

Referring now to FIG. 4, the high voltage generation circuitry 112 includes the inductor L having a first terminal connected to the battery voltage VBAT and a second terminal connected to the DC-DC boost converter 120. The high voltage VHV is generated at the output of the DC-DC boost converter 120. Feedback resistors Rb1, Rb2 are connected in series between the output of the DC-DC boost converter 120 and ground to form a voltage divider circuit, with a feedback voltage VFB generated at the tap node Nfb of the voltage divider circuit between the feedback resistors Rb1, Rb2.

The DC-DC boost converter 120 includes a boost circuit 121 and a boost controller 122. The boost circuit 121 is comprised of a switch (illustratively the n-channel transistor MN) connected between the second terminal of the inductor L and ground, and controlled by the PWM signal from the boost controller 122. The boost circuit 121 further includes a boost diode Db having an anode connected to the second terminal of the inductor L and a cathode connected to the output of the DC-DC boost converter 120, and a boost capacitor Cb connected between the output of the DC-DC boost converter 120 and ground.

When enabled by assertion of enable signal EN by the reconfigurable VHV controller 126 of the SOC 113, the boost circuit 121 operates to generate the high voltage VHV as being higher than the battery voltage VBAT. The high voltage VHV is generated across the capacitor Cb. In particular, when switch MN is closed by the assertion of the PWM signal by the boost controller 122, current flows from the battery VBAT into the inductor L, generating a magnetic field and thereby storing energy in the inductor L. At this point, the first terminal of the inductor L is positive with respect to the second terminal of the inductor L. When the switch MN is opened by the deassertion of the PWM signal by the boost controller 122, the sudden drop in current through the inductor L causes generation of a back-EMF opposite in polarity to the voltage across the inductor L to keep the current flowing. This results in two voltages, the battery voltage VBAT and the back EMF voltage across L1, in series with one another. This higher voltage, due to the lack of a current path through the switch MN, forward biases the diode Db, and the resulting current flow charges Cb to VHV (i.e. VBAT+$V_L$ minus the forward voltage drop across Db).

During this operation, the boost controller 122 operates the boost circuit 121 to regulate VHV such that the feedback voltage VFB remains equal to a reference voltage. A current IDAC is sourced by the reconfigurable VHV controller 126 to the tap Nfb between the feedback resistors Rb1 and Rb2, and is used by the reconfigurable VHV controller 126 to set the level of VHV. By sourcing the current IDAC to the tap Nfb between resistors Rb1 and Rb2, the feedback voltage VFB increases. This has the effect of causing the boost controller 122 to reduce VHV to thereby lower VFB to be equal to the reference voltage. Therefore, through the changing of the magnitude of the current IDAC, as well as the setting of the resistance values of the resistors Rb1 and Rb2, the voltage VHV can be set to a desired level.

Figure 5:
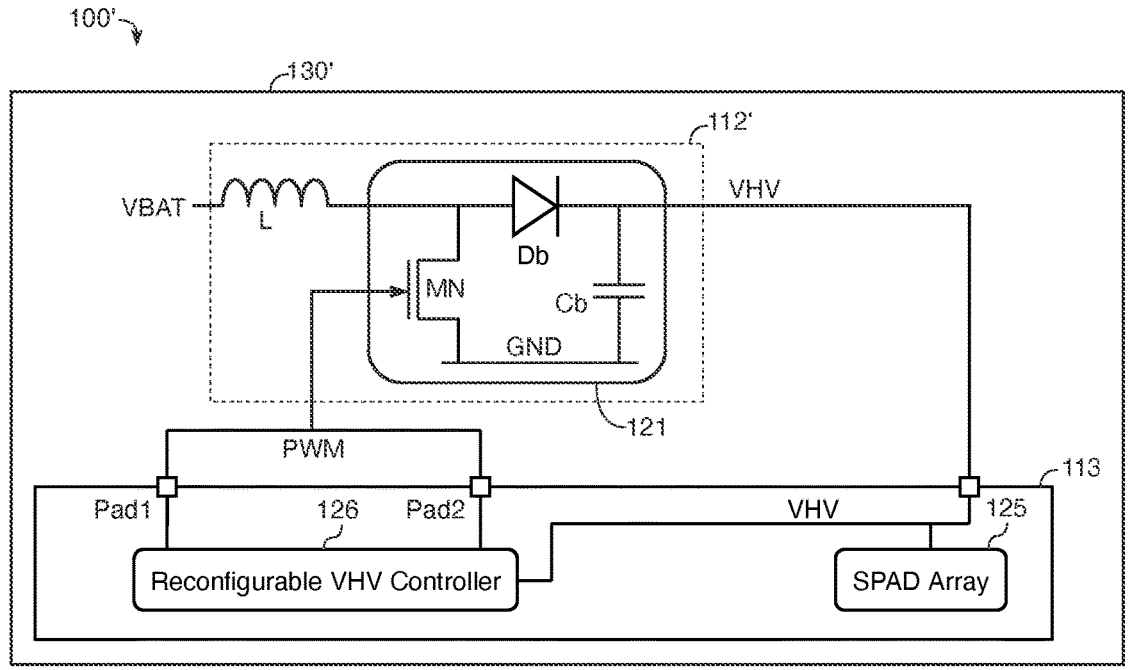
FIG. 5 is a block diagram of a second time-of-flight sensing system configuration described herein utilizing the system-on-a-chip described herein.

Referring now to FIG. 5, the boost circuit 121 remains the same as in FIG. 4, while the functionality of the boost controller (as well as the circuitry generating the feedback voltage) is performed by the reconfigurable VHV controller 126 of the SOC 113. Operation remains the same, keeping in mind that the functionality of the boost controller and circuitry generating the feedback voltage is, as stated, performed by the configurable VHV controller 126. Further details of the implementation of the boost controller and feedback circuitry into a single package with the SOC 113 may be found in French Patent Application Number 2200116, filed Jan. 7, 2022, which was commonly owned at the time of conception as the invention of the instant disclosure and remains commonly owned at the time of filing of the instant disclosure. The contents of French Patent Application Number 2200116 are incorporated by reference in their entirety to the maximum extent allowable under the law.

Figure 6A:
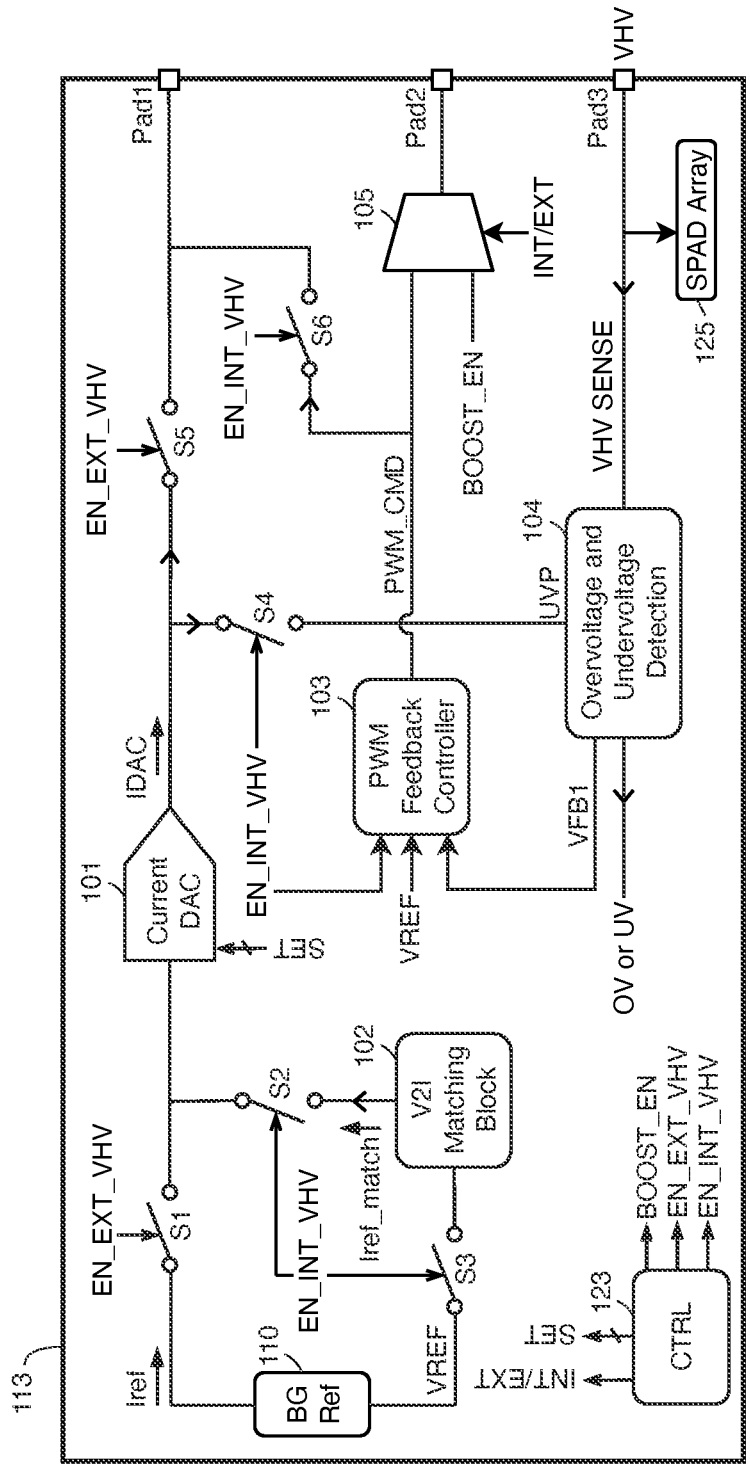
FIG. 6A is a schematic block diagram of the system-on-a-chip used in the time-of-flight sensing systems of FIGS. 4-5.

The SOC 113 is now described with reference to FIG. 6A. The SOC 113 includes a bandgap reference generator 110 that generates a bandgap voltage VREF (e.g., a temperature independent reference voltage) and a reference current Iref (e.g., a temperature independent reference current). A first switch S1, under control of an external operation mode signal EN_EXT_VHV, selectively couples the reference current Iref to the input of a current DAC 101 (e.g., a programmable current generator). A second switch S2, under control of an internal operation mode signal EN_INT_VHV, selectively couples the output of a matching block 102 to the input of the current DAC 101. The current DAC 101 generates a current IDAC at its output. A third switch S3, under control of the internal operation mode signal EN_INT_VHV, selectively couples the reference voltage VREF to the input of the matching block 102. A fourth switch S4, under control of the internal operation mode signal EN_INT_VHV, selectively couples the current IDAC to an input of the overvoltage/undervoltage detection circuit 104. A fifth switch S5, under control of the external operation mode signal EN_EXT_VHV, selectively couples the current IDAC to a pad PAD1.

A pulse width modulation (PWM) feedback controller 103 has an input connected to a resistive ladder within the overvoltage/undervoltage detection circuit 104 to receive a feedback signal VFB1. The PWM feedback controller 103 also receives as input the reference voltage VREF, as well as the internal operation mode signal EN_INT_VHV, and generates a PWM command voltage PWM_CMD as output. A multiplexer 105 selectively passes either the PWM command voltage PWM_CMD or a boost enable signal BOOST_EN as its output to a pad PAD2, under control of an INT/EXT selection signal.

A sixth switch S6, under control of the internal operation mode signal EN_INT_VHV, selectively connects the pad PAD1 to the output of the PWM feedback controller 103.

An array of SPADs 125 is connected to a pad PAD3 and receives the high voltage VHV. The overvoltage/undervoltage detection circuit 104 receives the high voltage VHV as input and generates a detection signal OR or UV, and its ladder generates the feedback voltage VFB1 as output.

A control circuit 123 generates the INT/EXT selection signal, as well as the internal operation mode signal EN_INT_VHV, the external operation mode signal EN_EXT_VHV, a boost enable signal BOOST_EN, and a SET signal. The SET signal is received by the current DAC 101, and the magnitude of the current IDAC is set by the current DAC 101 based upon the SET signal. Keeping in mind the above description of the magnitude of the current IDAC setting the voltage VHV, it should be appreciated that the SET signal may be continuously changed by the control circuitry 123 during operation to dynamically change VHV as the temperature of the SOC 113 changes.

The switches S1, S2, S3, S4, S5, S6 described above may be implemented as standard transmission gates.

Figure 6B:
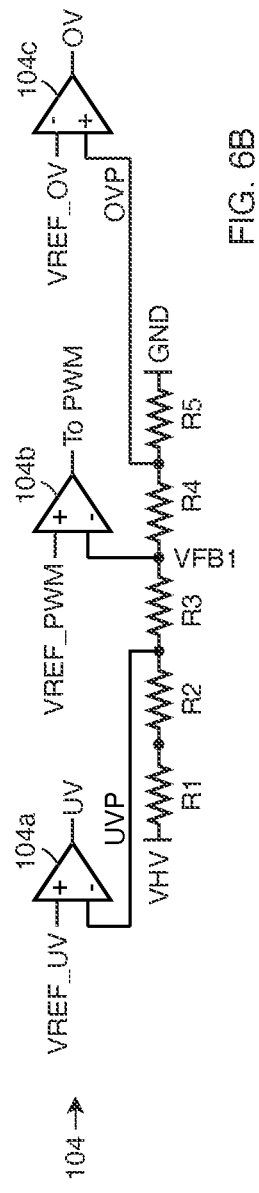
FIG. 6B is a schematic diagram of the overvoltage/undervoltage detection circuit of FIG. 6A.

The overvoltage/undervoltage detection circuit 104 is now described in detail with additional reference to FIG. 6B. The overvoltage/undervoltage detection circuit 104 includes a ladder formed by resistors R1, R2, R3, R4, R5 connected in series between the high voltage VHV and ground. The tap between resistors R2, R3 is connected to switch S4. A feedback voltage VFB1 is produced tap between resistors R3, R4.

A comparator 104a has a non-inverting input terminal connected to receiver a lower threshold voltage VREF_UV and an inverting input terminal connected to the tap between resistors R2, R3, with an undervoltage signal UV being generated at the output terminal of the comparator 104a. A comparator 104c has an inverting input terminal connected to receive an upper threshold voltage VREF_OV and a non-inverting input terminal connected to the tap between resistors R4, R5, with an overvoltage signal OV being generated at the output terminal of the comparator 104c. A comparator 104b has a non-inverting input terminal connected to a sawtooth reference PWM signal VREF PWM (having a frequency equal to the switching frequency of the boost circuit 121) and an inverting input terminal connected to the tap between resistors R3, R4 to receive the feedback voltage VFB1, with the PWM comparison signal PWM CP being generated at the output terminal of the comparator 104b.

In operation, the overvoltage/undervoltage detection circuit 104 serves to detect whether the high voltage VHV either exceeds an upper threshold VREF_OV (e.g., indicating whether an overvoltage condition is present) and falls below a lower threshold VREF_UV (e.g., indicating whether an undervoltage condition is present). Referring to FIG. 6B, when the voltage at the tap between nodes R4, R5 exceeds the upper threshold VREF_OV, the comparator 104c asserts its output, thereby asserting the overvoltage signal OV to indicate the overvoltage condition; conversely, when the voltage at the tap between the nodes R2, R3 falls below the lower threshold VREF_UV, the comparator 104a asserts its output, thereby asserting the undervoltage signal UV to indicate the undervoltage condition. Assertion of either OV or UV may be an indication of malfunction, indicating that the control circuit 123 is to cease operation of the boost circuit 121.

As explained, the SOC 113 may be operated in either an external generation mode (FIG. 4) or an in-package generation mode (FIG. 5), permitting the same SOC 113 to be universal to the two different configurations.

Figure 7:
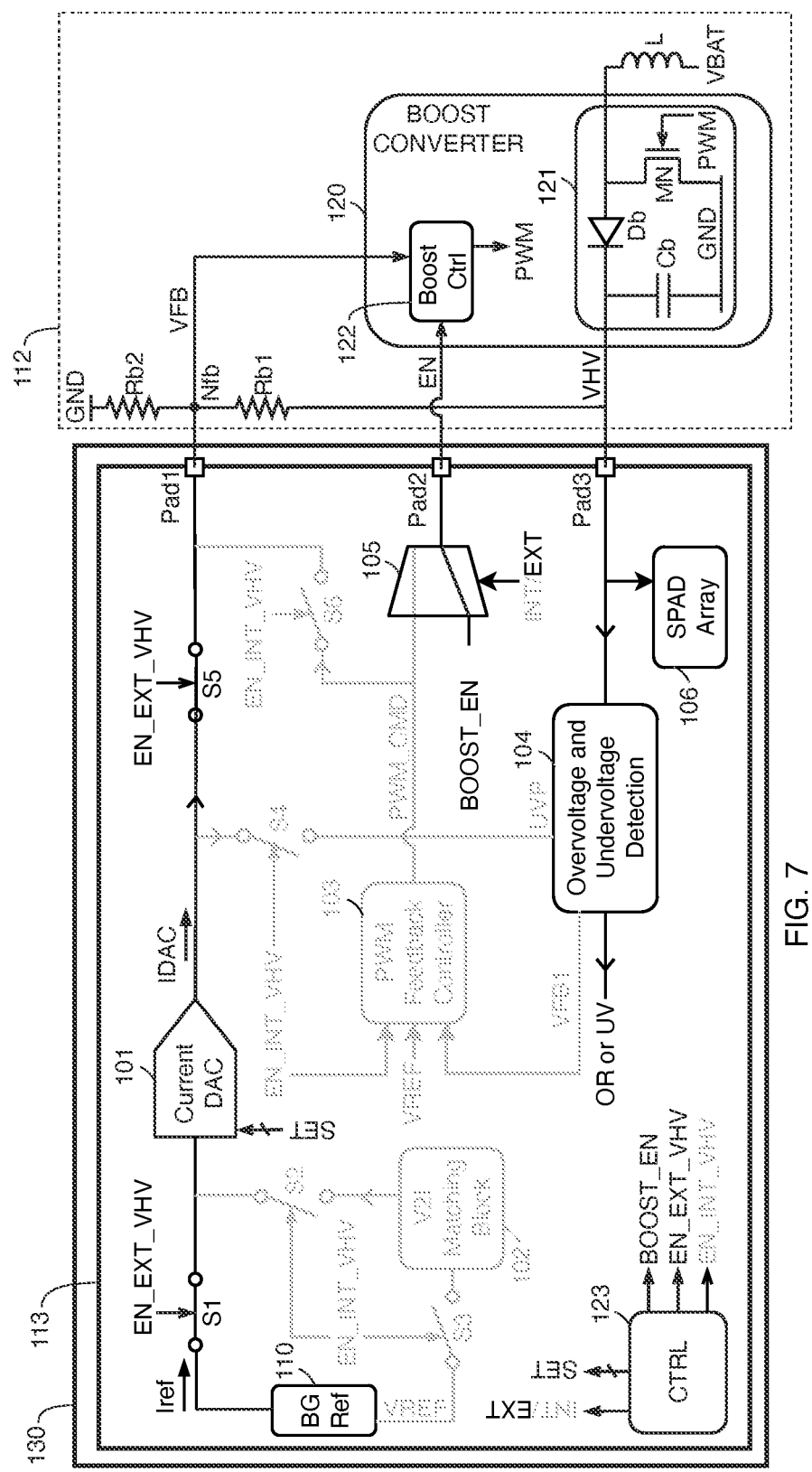
FIG. 7 is schematic block diagram of the system-on-a-chip of FIG. 6A in use with an external boost converter.

The external generation mode will now be described with additional reference to FIG. 7. In the external generation mode, the high voltage generation circuitry 112 is located externally to the package 130 (in which the SOC 113 resides). To begin the external generation mode, the control circuitry 123 sets the INT/EXT selection signal at the appropriate logic level so as to select the external generation mode, asserts the external operation mode signal EN_EXT_VHV signal, and deasserts the internal operation mode signal EN_INT_VHV, while asserting the boost enable signal BOOST_EN to activate the boost converter 120. Still further, the control circuitry 123 generates the SET signal to have a digital value that sets the magnitude of the current IDAC to a level that sets the high voltage VHV to a desired level.

This output by the control circuitry 123 has the effect of closing switches S1 and S5, while opening switches S2, S3, and S4. As a result, the bandgap reference generator 110 provides the temperature independent reference current Iref to the current DAC 101, which generates the current IDAC therefrom. The current IDAC is sourced to the tap Nfb between the resistors Rb1, Rb2 (which here may be high precision resistors, varying by 0.2% or so) and, as explained in detail, ultimately serves to set the level of the high voltage VHV. The INT/EXT selection signal being at the logic level to select the external generation mode causes the multiplexer 105 to output the enable signal EN to the pad PAD2.

As a result, the boost converter 120 operates as described above to generate the high voltage VHV at the pad Pad3, with VHV being used to bias the SPAD array 106 in performing time-of-flight operations.

Figure 8A:
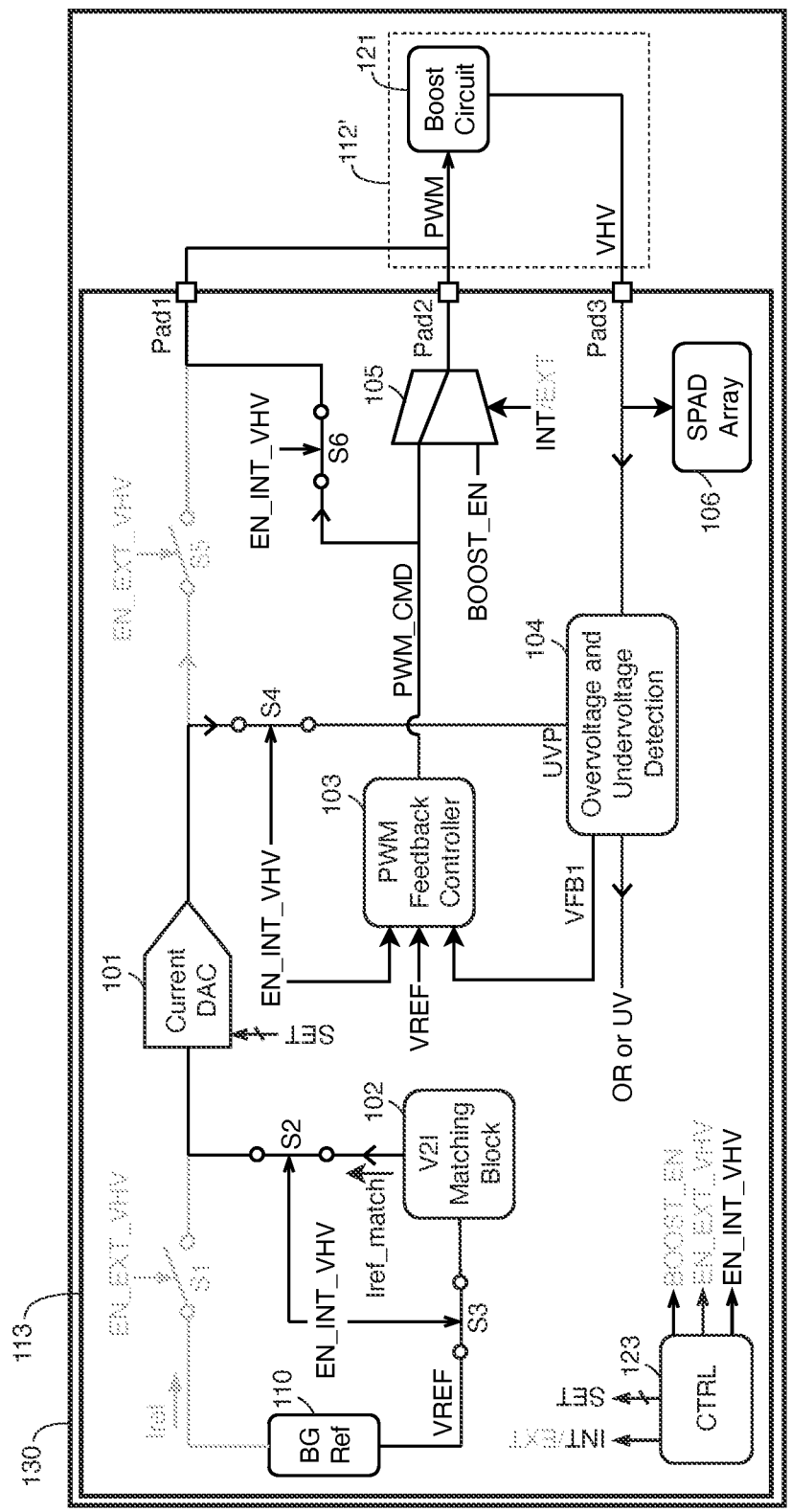
FIG. 8A is a schematic block diagram of the system-on-a-chip of FIG. 6A in use with a boost converter located in a same package as the system-on-a-chip.
Figure 8B:
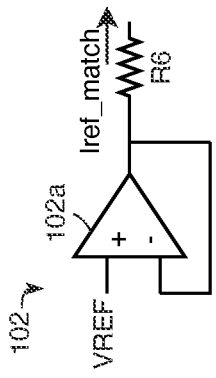
FIG. 8B is a schematic diagram of the matching circuit of FIG. 6A.

The internal generation mode will now be described with additional reference to FIGS. 8A and 8B.

In the internal generation mode, the high voltage generation circuitry 112' is located internally to the package 130' (in which the SOC 113 resides). To begin the internal generation mode, the control circuitry 123 sets the INT/EXT selection signal at the appropriate logic level so as to select the internal generation mode, asserts the internal operation mode signal EN IN VHV signal, and deasserts the external operation mode signal EN_EXT_VHV, while deasserting the boost enable signal BOOST_EN. Still further, the control circuitry 123 generates the SET signal to have a digital value that sets the magnitude of the current IDAC to a level that sets the high voltage VHV to a desired level.

This output by the control circuitry 123 has the effect of closing switches S3, S4, and S6, while opening switches S1 and S5. As a result, the bandgap reference generator 110 provides the temperature independent reference voltage Vref to the matching block 102, which generates a matched input current Iref_match for use by the current IDAC 101 in generating the current IDAC, which as explained in detail, ultimately serves to set the level of the high voltage VHV.

The resistance values of the resistors, R1, R2, R3, R4, R5 are matched (but not necessarily equal in absolute value), but in reality may vary by up to 25% or so because they are not high-precision. Therefore, the matching block 102 includes a resistor R6 that has a resistance value equal to the combined resistance values of R1, R2, R3, R4, R5. As shown in FIG. 8B, the matching block 102 includes an amplifier 123a in a unity gain configuration receiving the temperature independent reference voltage VREF at its non-inverting input terminal, and providing its output to resistor R6, with a matched reference current Iref_match therefore flowing through resistor R6. The use of the resistor R6 being matched in resistance to the combined resistance of R1, R2, R3, R4, R5 and being formed by the same process as R6 provides for the matched reference current Iref_match, providing for the generation of IDAC and therefore VHV as being independent of process corner and stable over temperature. To state it differently, Iref_match will vary as the resistances of R1, R2, R3, R4, R5 vary.

The current IDAC is sourced to the tap between the resistors R2, R3 of the overvoltage/undervoltage detection circuit 104, and the feedback voltage VREF1 is generated at the tap between the resistors R3, R4—appreciate here, therefore, that the ladder formed by resistors R1, R2, R3, R4, R5 is acting as the feedback ladder for the generation and regulation of the high voltage VHV, as well as for overvoltage/undervoltage condition determination. The INT/EXT selection signal being at the logic level to select the internal generation mode causes the multiplexer 105 to output the PWM command signal PWM_CMD to the pad Pad2 for use by the boost circuit 121 as the PWM signal.

The PWM feedback controller 103 acts as the boost controller described above, adjusting the generation of PWM_CMD (and therefore PWM) to operate the boost circuit 121 such that the high voltage VHV matches the feedback voltage VFB1. Notice that in this internal generation mode, the PWM signal is provided at both Pad1 as well as at Pad2, and both pads are used to drive the boost circuit 121. This is because the transistor within the boost circuit 121 is a large component, and the driving thereof involves a large drive strength.

As explained, the SOC 113 design permits use with either external high voltage generation circuitry 112 (FIG. 4) or high voltage generation circuitry 112' integrated together with the SOC 113 into a single package 130' (FIG. 5), keeping cost down as one production line and one SKU can service both configurations. The SOC 113 design also keeps the amount of space occupied by unused components of the SOC 113 to a small amount, as the highest area consuming components (the current DAC 101, voltage ladder R1-R5, and comparators 104a-104c) are used in both configurations.

It is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device comprising a system-on-a-chip (SOC) within a package, the SOC having, formed therein, at least:
a reference generator;
a matching circuit;
a programmable current generator configured to generate a programmed current;
a pulse width modulation controller;
an overvoltage/undervoltage detection circuit configured to receive a high voltage from a third output pad and determine whether an overvoltage or undervoltage condition is present;
a multiplexer configured to selectively pass an input signal to a second output pad;
at least one single photon avalanche diode (SPAD) having an anode coupled to receive the high voltage; and
switching circuitry configured to, in an external generation mode:
cause the multiplexer to pass an enable signal as the input signal to the second output pad;
connect a first output of the reference generator to the programmable current generator such that the programmable current generator receives a temperature independent reference current generated by the reference generator in the external generation mode; and
connect the programmed current to a first output pad;
wherein the switching circuitry is further configured to, in an internal generation mode:

connect a second output of the reference generator to the matching circuit such that the matching circuit receives a temperature independent reference voltage generated by the reference generator in the internal generation mode;
connect an output of the matching circuit to the programmable current generator so that the programmable current generator receives a matched temperature independent reference current generated by the matching circuit in the internal generation mode;
connect the programmed current to the overvoltage/undervoltage detection circuit, with a feedback voltage being generated by components of the overvoltage/undervoltage detection circuit in the internal generation mode;
cause the multiplexer to pass a pulse width modulation (PWM) signal as the input signal to the second output pad, the PWM signal being generated by the pulse width modulation controller based upon the feedback voltage, in the internal generation mode; and
couple the PWM signal to the first output pad.

2. The electronic device of claim 1,
wherein when the switching circuitry is in the external generation mode, the electronic device further comprises, outside of the package:
feedback circuitry having a feedback node connected to the first output pad; and
a boost converter having a power input connected to a battery voltage through an inductor, a feedback input connected to the feedback node, an enable input connected to the second output pad, and an output at which the high voltage is generated, the output being connected to the third output pad; and
wherein when the switching circuitry is in the internal generation mode, the electronic device further comprises, inside the package:
a boost circuit comprising: a boost diode having a cathode coupled to the third output pad and an anode coupled to a battery voltage through an inductor; a switch connected between the anode of the boost diode and ground, the switch coupled to the first and second output pads to be controlled by the PWM signal; and a capacitor coupled between the third output pad and ground, wherein the high voltage is produced at the third output pad.

3. The electronic device of claim 1, wherein the overvoltage/undervoltage detection circuit comprises:
a resistive ladder coupled between the third output pad and ground, the resistive ladder having at least first, second, and third taps, each tap being located between two immediately adjacent and directly electrically connected resistors of the resistive ladder, wherein the feedback voltage is generated at the second tap;
a first comparator configured to assert an undervoltage condition alert signal if a voltage at the first tap is less than a lower threshold; and
a second comparator configured to assert an overvoltage condition alert signal if a voltage at the third tap is greater than an upper threshold.

4. The electronic device of claim 3, wherein the matching circuit comprises an amplifier in a unity gain configuration configured to buffer the temperature independent reference voltage to a first terminal of a matching resistor, with the switching circuitry, in the internal generation mode, connecting a second terminal of the matching resistor to the input of the programmable current generator; wherein a resistance of the matching resistor is equal to a total resistance of the resistive ladder.

5. The electronic device of claim 1, wherein the switching circuitry comprises:
a first switch connected between the reference generator and an input of the programmable current generator;
a second switch connected between the input of the programmable current generator and the output of the matching circuit;
a third switch connected between the reference generator and an input of the matching circuit;
a fourth switch connected between an output of the programmable current generator and a tap of a resistive ladder within the overvoltage/undervoltage detection circuit;
a fifth switch connected between the output of the programmable current generator and the first output pad; and
a sixth switch connected between an output of the PWM controller and the first output pad.

6. The electronic device of claim 5, wherein the SOC further comprises control circuitry configured to:
in the external generation mode, cause the first and fifth switches to close while causing the second, third, fourth, and sixth switches to open; and
in the internal generation mode, cause the second, third, fourth, and sixth switches to close while causing the first and fifth switches to open.

7. The electronic device of claim 1, wherein the SOC further comprises control circuitry configured to generate a control signal for the programmable current generator based upon which the programmable current generator sets a magnitude of the programmed current; and wherein the high voltage is set based upon the programmed current.

8. An electronic device comprising a system-on-a-chip (SOC) within a package, the SOC having, formed therein, at least:
a reference generator;
a matching circuit;
a programmable current generator configured to generate a programmed current;
a pulse width modulation (PWM) controller;
an overvoltage/undervoltage detection circuit configured to receive a high voltage from a third output pad;
a multiplexer configured to selectively pass an input signal to a second output pad;
at least one single photon avalanche diode (SPAD) having an anode coupled to receive the high voltage; and
switching circuitry comprising:
a first switch connected between the reference generator and an input of the programmable current generator;
a second switch connected between the input of the programmable current generator and the output of the matching circuit;
a third switch connected between the reference generator and an input of the matching circuit;
a fourth switch connected between an output of the programmable current generator and a tap of a resistive ladder within the overvoltage/undervoltage detection circuit;
a fifth switch connected between the output of the programmable current generator and a first output pad; and
a sixth switch connected between the output of the PWM controller and the first output pad;
control circuitry configured to operate the switching circuitry and multiplexer in either an external generation mode or an internal generation mode.

9. The electronic device of claim 8, wherein the control circuitry, in the external generation mode, causes the first and fifth switches to close while causing the second, third, fourth, and sixth switches to open, and causes the multiplexer to pass an enable signal as the input signal to the second output pad; and
wherein the control circuitry, in the internal generation mode, causes the second, third, fourth, and sixth switches to close while causing the first and fifth switches to open, and causes the multiplexer to pass a pulse width modulation (PWM) signal as the input signal to the second output pad, the PWM signal being generated by the PWM controller.

10. The electronic device of claim 9, wherein the overvoltage/undervoltage detection circuit comprises:
the resistive ladder coupled between the third output pad and ground, the resistive ladder having at least first, second, and third taps, each tap being located between two immediately adjacent and directly electrically connected resistors of the resistive ladder, wherein the feedback voltage is generated at the second tap;
a first comparator configured to compare a voltage at the first tap to a lower threshold; and
a second comparator configured to compare a voltage at the third tap to an upper threshold.

11. The electronic device of claim 10, wherein the matching circuit comprises an amplifier in a unity gain configuration configured to buffer a temperature independent reference voltage to a first terminal of a matching resistor, with the switching circuitry, in the internal generation mode, connecting a second terminal of the matching resistor to the input of the programmable current generator; wherein a resistance of the matching resistor is equal to a total resistance of the resistive ladder.

12. The electronic device of claim 8, wherein when the switching circuitry is in the external generation mode, the electronic device further comprises, outside of the package:
feedback circuitry having a feedback node connected to the first output pad; and
a boost converter having a power input connected to a battery voltage through an inductor, a feedback input connected to the feedback node, an enable input connected to the second output pad, and an output at which the high voltage is generated, the output being connected to the third output pad.

13. The electronic device of claim 9, wherein when the switching circuitry is in the internal generation mode, the electronic device further comprises, inside the package:
a boost circuit comprising: a boost diode having a cathode coupled to the third output pad and an anode coupled to a battery voltage through an inductor; a switch connected between the anode of the boost diode and ground, the switch coupled to the first and second output pads to be controlled by the PWM signal; and a capacitor coupled between the third output pad and ground, wherein the high voltage is produced at the third output pad.

14. The electronic device of claim 8, wherein the SOC further comprises control circuitry configured to generate a control signal for the programmable current generator based upon which the programmable current generator sets a magnitude of the programmed current.

15. An electronic device comprising a package, the package containing, at least:

a system-on-a-chip (SOC) having, formed therein, at least:
  a reference generator;
  a matching circuit;
  a programmable current generator configured to generate a programmed current;
  a pulse width modulation controller;
  an overvoltage/undervoltage detection circuit configured to receive a high voltage from a third output pad;
  a multiplexer configured to selectively pass an input signal to a second output pad;
  at least one single photon avalanche diode (SPAD) having an anode coupled to receive the high voltage;
  circuitry configured to selectively:
    connect a first output of the reference generator to the matching circuit such that the matching circuit receives a temperature independent reference voltage generated by the reference generator;
    connect an output of the matching circuit to the programmable current generator so that the programmable current generator receives a matched temperature independent reference current generated by the matching circuit;
    connect the programmed current to the overvoltage/undervoltage detection circuit, with a feedback voltage being generated by components of the overvoltage/undervoltage detection circuit;
    cause the multiplexer to pass a pulse width modulation (PWM) signal at its input to the second output pad, the PWM signal being generated by the pulse width modulation controller based upon the feedback voltage; and
    couple the PWM signal to a first output pad; and
  a boost circuit comprising:
    a boost diode having a cathode coupled to the third output pad and an anode coupled to a battery voltage through an inductor;
    a switch connected between the anode of the boost diode and ground, the switch coupled to the first and second output pads to be controlled by the PWM signal; and
    a capacitor coupled between the third output pad and ground, wherein the high voltage is produced at the third output pad.

16. The electronic device of claim 15, wherein the overvoltage/undervoltage detection circuit comprises:
  a resistive ladder coupled between the third output pad and ground, the resistive ladder having at least first, second, and third taps, each tap being located between two immediately adjacent and directly electrically connected resistors of the resistive ladder, wherein the feedback voltage is generated at the second tap;
  a first comparator configured to compare a voltage at the first tap to a lower threshold; and
  a second comparator configured to compare a voltage at the third tap to an upper threshold.

17. The electronic device of claim 16, wherein the matching circuit comprises an amplifier in a unity gain configuration configured to buffer the temperature independent reference voltage to a first terminal of a matching resistor, with the circuitry, in an internal generation mode, connecting a second terminal of the matching resistor to the input of the programmable current generator; wherein a resistance of the matching resistor is equal to a total resistance of the resistive ladder.

18. The electronic device of claim 15, wherein the SOC further comprises control circuitry configured to generate a control signal for the programmable current generator based upon which the programmable current generator sets a magnitude of the programmed current.

* * * * *